(12) United States Patent
Park et al.

(10) Patent No.: US 7,724,082 B2
(45) Date of Patent: May 25, 2010

(54) METHOD AND APPARATUS FOR PULSE WIDTH MODULATION IN A SWITCHING AMPLIFIER

(75) Inventors: Sang Jin Park, 102-401 Kukdong Apt. 752-1 Mok-dong, Yangcheon-gu, Seoul (KR); Yong Hun Cho, Kyunggi-do (KR); Yun Do Kim, Gyeonggi-do (KR)

(73) Assignees: UBI Sound Co., Ltd., Seoul (KR); Sang Jin Park, Seoul (KR)

( * ) Notice: Subject to any disclaimer, the term of this patent is extended or adjusted under 35 U.S.C. 154(b) by 233 days.

(21) Appl. No.: 11/913,113

(22) PCT Filed: May 4, 2006

(86) PCT No.: PCT/KR2006/001690
§ 371 (c)(1),
(2), (4) Date: Oct. 30, 2007

(87) PCT Pub. No.: WO2006/121260

PCT Pub. Date: Nov. 16, 2006

(65) Prior Publication Data
US 2008/0224788 A1    Sep. 18, 2008

(30) Foreign Application Priority Data
May 10, 2005    (KR) ............... 10-2005-0038932

(51) Int. Cl.
*H03F 3/38* (2006.01)
(52) U.S. Cl. ........................................... 330/10
(58) Field of Classification Search .............. 330/10, 330/251, 207 A; 375/238
See application file for complete search history.

(56) References Cited

U.S. PATENT DOCUMENTS

| | | | |
|---|---|---|---|
| 6,373,336 B1 | 4/2002 | Anderskouv | |
| 6,593,806 B1 | 7/2003 | Melanson | |
| 7,378,904 B2 * | 5/2008 | Risbo | 330/10 |
| 2001/0013808 A1 | 8/2001 | Fujisawa | |

FOREIGN PATENT DOCUMENTS

JP    2003-110441    4/2003

OTHER PUBLICATIONS

International Search Report for corresponding International Application No. PCT/KR2006/001690 dated Aug. 10, 2006.
Written Opinion of the International Searching Authority for International Application No. PCT/KR2006/001690 dated Aug. 10, 2006.

* cited by examiner

*Primary Examiner*—Robert Pascal
*Assistant Examiner*—Khiem D Nguyen
(74) *Attorney, Agent, or Firm*—Jae Y. Park; Kile Goekjian Reed & McManus

(57) ABSTRACT

There is provided a method and apparatus for output pulse width modulation in a digital amplifier including: a determining step of adding or subtracting a value corresponding to a predetermined offset to or from an input audio signal alternately according to a period of the input audio signal, thereby determining a sign of a resulting value of adding or subtracting; a switching step of outputting the input audio signal to a first port based on the determined sign, or outputting the input audio signal to a second port after inverting the input audio signal into a positive number; an adjusting step of adding a value of a predetermined switching time to the audio signals output from the first port and the second port, and outputting a resulting value of adding; and a modulating step of performing pulse width modulation on the audio signals output from the adjusting step and outputting a first modulation signal and a second modulation signal.

4 Claims, 10 Drawing Sheets

[Fig 1] (PRIOR ART)
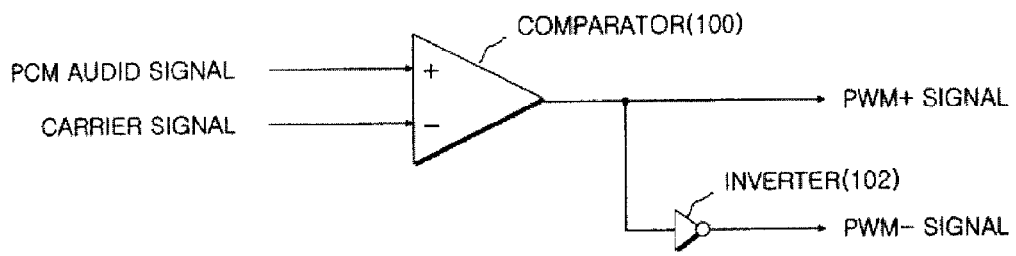
[Fig 2] (PRIOR ART)
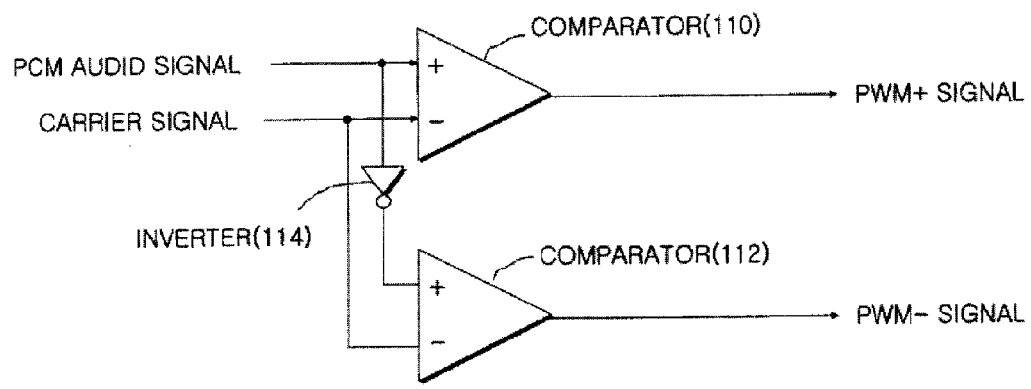

METHOD AND APPARATUS FOR PULSE WIDTH MODULATION IN A SWITCHING AMPLIFIER

CROSS-REFERENCE TO RELATED APPLICATIONS

This application claims priority to Korean Patent Application No. KR-10-2005-0038932 filed on May 10, 2005 and is a national stage filing of PCT Patent Application No. PCT/KR2006/001690 filed on May 4, 2006, the entire contents of which are incorporated herein by reference.

TECHNICAL FIELD

The present invention relates to an audio signal process, and more particularly, to a method and apparatus for pulse width modulation in a digital switching amplifier.

BACKGROUND ART

For amplifying an audio signal, an analog amplification system and a digital amplification system are used. The analog amplification system converts a pulse code modulation (PCM) audio signal into an analog signal and performs current amplification and voltage amplification having an intermediate voltage stage, so amplification efficiency decreases. On the other hand, the digital amplification system performs pulse width modulation on the PCM audio signal and also performs switching amplification by repeating ON/OFF, and the PCM audio signal is output through an analog filter. Therefore, the digital amplification system has amplification efficiency greater than that of the analog amplification system. In addition, the amplification circuit of the digital amplification system can be embodied in a small size and has low power consumption. There are many kinds of the digital amplification systems. In a digital differential drive system used in the digital amplification system, there are also many kinds of systems including an AD drive system and BD drive system.

FIG. 1 is a view showing a pulse width modulation circuit in a conventional AD drive system;

Referring to FIG. 1, a PCM audio signal is input to a (+) port of a comparator 100, and a carrier signal is input to a (−) port of the comparator 100. The carrier signal, for example, has a triangle waveform. The comparator 100 outputs a value of +1 or −1 according to a result of comparing the two signals input to the (+) port and the (−) port. For example, if a value of the PCM audio signal input to the (+) port is larger than a value of the carrier signal input to the (−) port, a value of +1 is output, otherwise, −1 is output. Accordingly, output waveform of a PWM+ signal, which is a positive PWM signal, is a pulse width modulation signal having a different pulse width according to a value of the input PCM audio signal. A PWM− signal, which is a negative PWM signal, is the inverted PWM+ signal by an inverter 102.

FIG. 2 is a view showing a pulse width modulation circuit in a conventional BD drive system;

In the BD drive system, two comparators 110 and 112 are used, a PCM signal input to a (+) port of the comparator 110 is inverted by an inverter 114 and input to a (+) port of the other comparator 112. The same Triangle waveforms are used for carrier signals in both comparators 110 and 112. Therefore, a PWM+ signal, which is a positive PCM signal, and a PWM− signal, which is a negative signal, are output.

FIG. 3 is a view showing a pulse width modulation output signal according to the conventional BD drive system;

The PCM audio signal 200 is input to the (+) port of the comparator 110, and the carrier signal 210 is input to the (−) port of the comparator 110. The comparator 110 outputs a value of +1 or −1 according to a result of comparing the two signals input to the (+) port and the (−) port, so that the PWM+ signal 220 which is a positive PWM signal is output. The inverted PCM audio signal 200 is input to the (+) port of the other comparator 112, so the PWM− signal 230 which is a negative PWM signal is output. Referring to FIG. 3, modulated pulse widths of the PWM+ and the PWM− signals 220 and 230 vary according to a value of the PCM audio signal.

When the PWM+ and the PWM− signals 220 and 230 are connected to both terminals of load, a differential output 240 subtracting the PWM− signal 230 from the PWM+ signal 220 is applied to the load. A waveform of the differential output 240 is the same as the output waveform denoted by reference numeral 240 shown in FIG. 3.

According to the conventional method of pulse width modulation, when the input PCM audio signal is 0, bias currents of the load connected to the differential output can be controlled. However, residual noises due to switching exist in each of the PWM+ and the PWM− signals. Further, some currents flow through a common ground, and unnecessary heat is generated. Thus, amplification efficiency decreases, and pop noises, which may damage a speaker and offend a user's ear, are generated when the amplifier operates.

DETAILED DESCRIPTION OF THE INVENTION

Technical Goal of the Invention

The present invention provides a method and apparatus for output pulse width modulation in a digital switching amplifier capable of dividing an input audio signal according to a sign of the input audio signal value, converting values of the divided audio signals into positive, and performing pulse width modulation on each of the positive audio signals, thereby reducing pulse width of a differential output applied to load as much as possible in a case where a value of the input audio signal is practically 0.

Disclosure of the Invention

According to an aspect of the present invention, there is provided a method of output pulse width modulation in a digital amplifier comprising: a determining step of adding or subtracting a value corresponding to a predetermined offset to or from an input audio signal alternately according to a period of the input audio signal, thereby determining a sign of a resulting value of adding or subtracting; a switching step of outputting the input audio signal to a first port when the determined sign is positive, and outputting the input audio signal to a second port after inverting the input audio signal into a positive number when the determined sign is negative; an adjusting step of adding a value corresponding to a pulse width for a minimum time required for switching to the audio signals output from the first port and the second port, and outputting a resulting value of adding; and a modulating step of performing pulse width modulation on the audio signals output from the adjusting step and outputting a first modulation signal and a second modulation signal.

According to another aspect of the present invention, there is provided an apparatus for output pulse width modulation in a digital amplifier comprising: an offset adder adding or subtracting a value corresponding to a predetermined offset to or from an input audio signal alternately according to a period of the input audio signal; a sign determining unit determining a sign of a value output from the offset adder; an inverter and a switching unit outputting the audio signal to a first port when the determined sign is positive, and outputting the input audio signal to a second port after inverting the input audio signal into a positive number when the detected sign is negative; a minimum pulse width compensator adding a value corresponding to a pulse width for a minimum time required for switching to the audio signals output from the first port and the second port, and outputting resulting values of adding; and a modulation unit performing pulse width modulation on the audio signals output from the minimum pulse width compensator and outputting a first modulation signal and a second modulation signal.

BRIEF DESCRIPTION OF THE DRAWINGS

FIG. 1 is a view showing a pulse width modulation circuit in a conventional AD drive system;

FIG. 2 is a view showing a pulse width modulation circuit in a conventional BD drive system;

BEST MODE FOR CARRYING OUT THE INVENTION

Now, exemplary embodiments according to the present invention will be described in detail with reference to the accompanying drawings.

Figure 3:
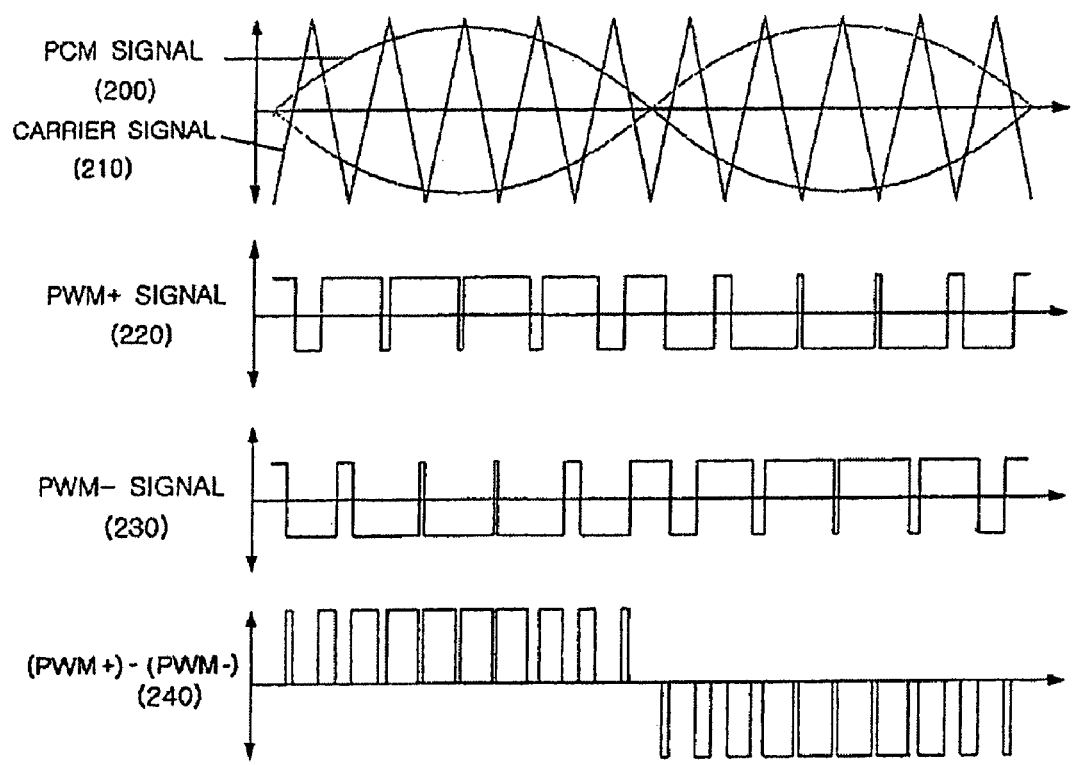
FIG. 3 is a view showing a pulse width modulation output signal according to a conventional BD drive system.
Figure 4:
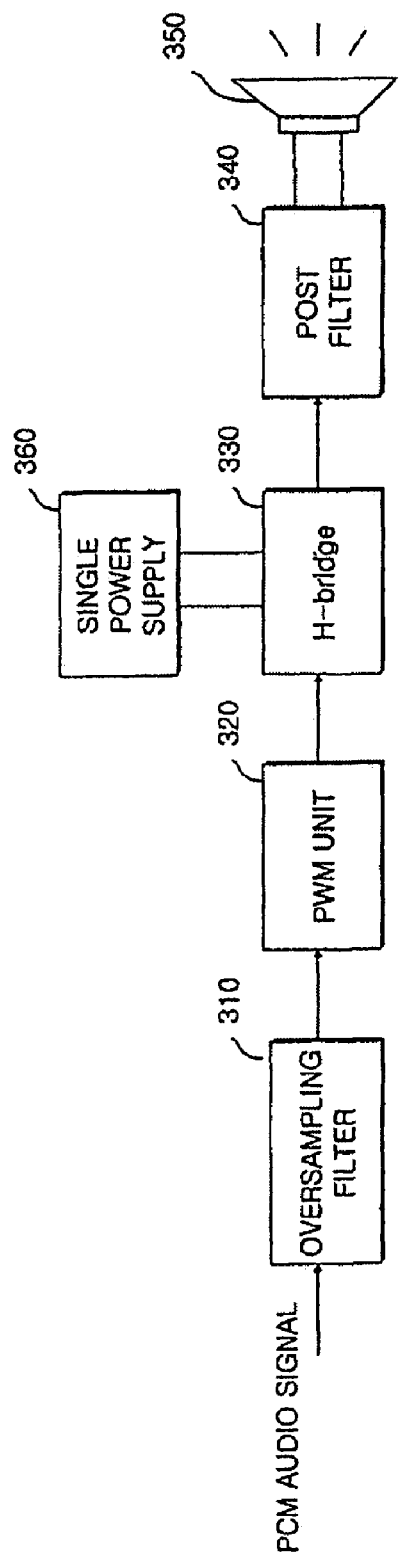
FIG. 4 is a view showing a structure of a digital switching amplifier according to a preferred embodiment of the present invention.

FIG. 4 is a view showing a structure of a digital switching amplifier according to a preferred embodiment of the present invention;

A digital switching amplifier includes an oversampling filter 310, a pulse width modulation (PWM) unit 320, an H-bridge 330, a post filter 340, and a single power supply 360. The oversampling filter 310 receives a pulse code modulation (PCM) audio signal and increases sampling rate of the PCM audio signal, so that the oversampling filter 310 outputs the oversampled PCM audio signal. For example, when a 16-bit PCM audio signal having a sampling rate of 48 KHz is received, the oversampling filter 310 performs octuple oversampling and converts the 16-bit PCM audio signal into 24-bit PCM audio signal having a sampling rate of 384 KHz and outputs the oversampled PCM audio signal. The PWM unit 320 receives the oversampled PCM audio signal and performs pulse width modulation, so that the PWM unit 320 outputs PWM+ and PWM− signals. Detailed structure and operations of the PWM unit 320 will be described later.

The H-bridge 330 is a switching device of which power is supplied by the single power supply 360 to output the amplified PWM+ and the PWM− signals. The post filter 340 is a kind of low pass filter. The post filter 340 removes carriers from the pulse width modulated signals and outputs the carrier-removed pulse width modulated signals. These recovered signals are input into a speaker 350.

Figure 5:
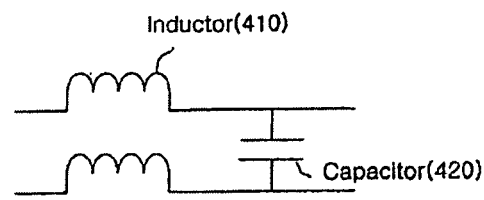
FIG. 5 is a circuit diagram showing a post filter according to an embodiment of the present invention.

FIG. 5 is a circuit diagram showing the post filter 340 according to the embodiment of the present invention.

In FIG. 5, the post filter 340 includes an inductor (L) 410 and a capacitor (C) 420. In some cases, the post filter 340 may be omitted.

Figure 6:
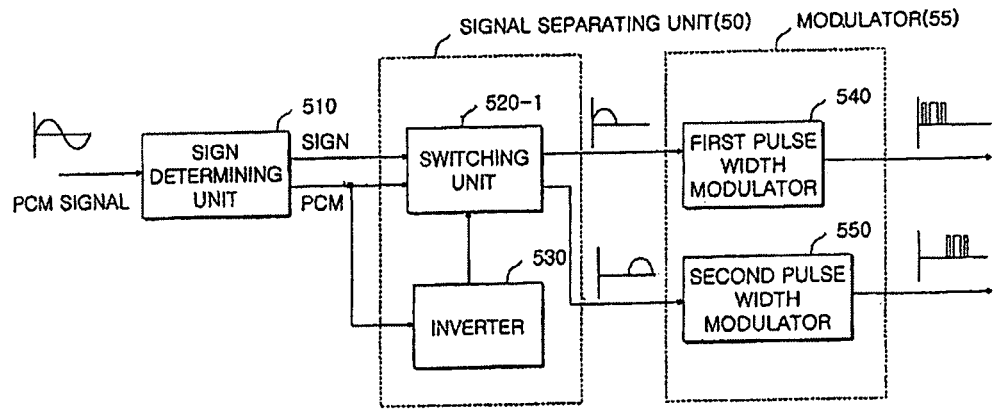
FIG. 6 is a view showing a structure of a PWM unit according to a first embodiment of the present invention.

FIG. 6 is a view showing a structure of the PWM unit 320 according to a first embodiment of the present invention;

The PWM unit includes a sign determining unit 510, a switching unit 520-1, an inverter 530, a first pulse width modulator 540, and a second pulse width modulator 550. The switching unit 520-1 and the inverter 530 are included in a signal separating unit 50. The first and the second pulse width modulators 540 and 550 are included in a modulator 55. The sign determining unit 510 determines a sign of the input PCM audio signal. The most significant bit of the PCM audio signal represented as 2's complements indicates a sign. For example, when the most significant bit of a PCM value is 0, the PCM value is a positive number. When the most significant bit of a PCM value is 1, the PCM value is a negative number. Therefore, the sign determining unit 510 reads the most significant bit of an input PCM value and determines a sign of the input PCM audio signal. The determined sign information is transmitted to the switching unit 520-1.

The input PCM audio signal is not only transmitted to the switching unit 520-1 but also inverted in the inverter 530. By the inversion, the negative signal is inverted into a positive signal having the same magnitude. The inversion is, for example, multiplication a PCM audio signal by −1. The inverted PCM signal is also transmitted to the switching unit 520-1. The switching unit 520-1 selectively switches the original PCM signal and the inverted PCM signal according to the sign information transmitted from the signal determining unit 510. For example, when a value of the PCM is a positive number, that is, the most significant bit is 0, the original PCM signal is output. When a value of the PCM is a negative number, that is, the most significant number is 1, the inverted PCM signal is output. Therefore, all the waveforms output from the switching unit 520-1 have positive PCM values.

The first and the second pulse width modulators 540 and 550 perform pulse width modulation on the positive PCM signal and the inverted PCM signal output from the switching unit 520-1, respectively. In the pulse width modulation, there is no need to allocate the pulse width to a value of a negative PCM. Therefore, in order to increase precision, the maximum pulse width is allocated to the maximum value of the input signal, and the pulse width of 0 is allocated to the input signal having a value of 0. Accordingly, the first pulse width modulator 540 outputs a PWM+ signal, and the second pulse width modulator 550 outputs a PWM− signal. Referring to FIG. 6, both the output PWM+ and PWM− signals are in the positive direction.

Figure 7:
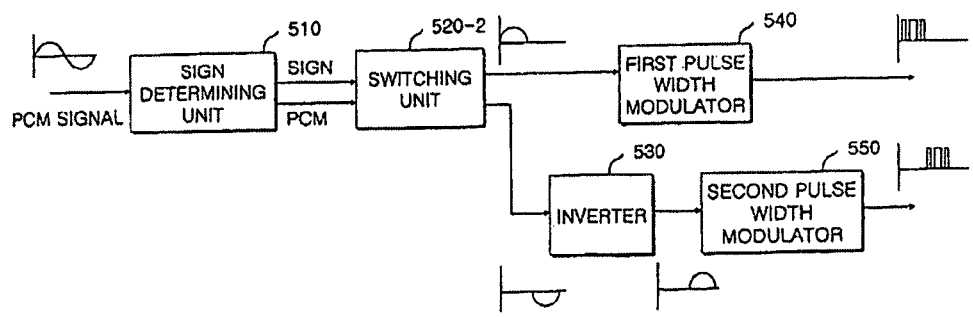
FIG. 7 is a view showing a structure of a PWM unit according to a second embodiment of the present invention.

FIG. 7 is a view showing a structure of the PWM unit 320 according to a second embodiment of the present invention;

referring to FIG. 7, the inverter 530 may be disposed at the back of the switching unit 520-2 not in front of the switching unit 520-2. The signals input to the first and second pulse width modulators 540 and 550 are the same ones in FIG. 6, so the output PWM+ and PWM− signals are the same as those in FIG. 6 in the end. Alternatively, a function of the inverter 530 may be included in the second pulse width modulator 550, so that the second pulse width modulator 550 inverts a negative audio signal into a positive audio signal and performs pulse width modulation equal to that of the first pulse width modulator 540.

Figure 8:
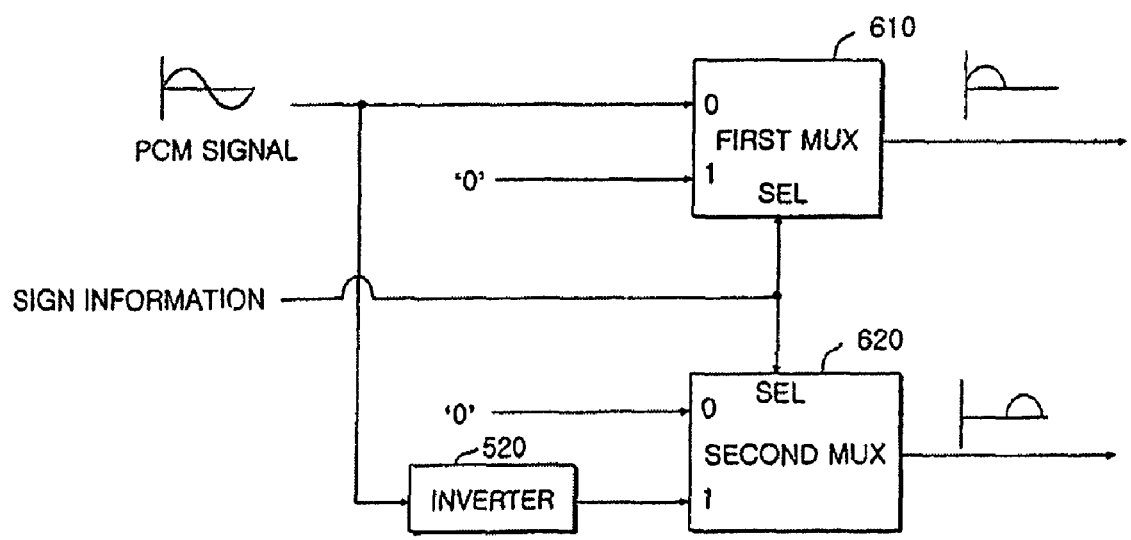
FIG. 8 is a view showing a switching unit according to an embodiment of the present invention.

FIG. 8 is a view showing a switching unit according to an embodiment of the present invention;

In FIG. 8, the switching unit can be embodied by a multiplexer. The PWM unit shown in FIG. 6 can generate PCM signals input to the first and the second pulse width modulators 540 and 550 by using a first and a second MUX 610 and 620 instead of a switch. That is, the PCM audio signal is transmitted to '0' input port of the first MUX 610, and the PCM audio signal inverted by the inverter 520 is transmitted to '1' input port of the second MUX 620. A value of '0' is input to the '1' input port of the first MUX 610 and the '0' input port of the second MUX 620. Sign information of the PCM signal is input to a selecting port SEL.

Accordingly, when the sign information is '0', the input PCM signal is output to an output port of the first MUX 610 by the first MUX 610, and the second MUX 620 outputs a value of '0' which is connected to the '0' input port. On the other hand, when the sign information is '1', a value of '0' which is connected to the '1' input port is output by the first MUX 610, and the second MUX 620 outputs the inverted PCM signal which is connected to the '1' input port. Therefore, the signals are the same as the positive and negative PCM signals output by switching (the signal input to second MUX is a positive PCM signal which is the inverted original PCM signal).

Figure 9:
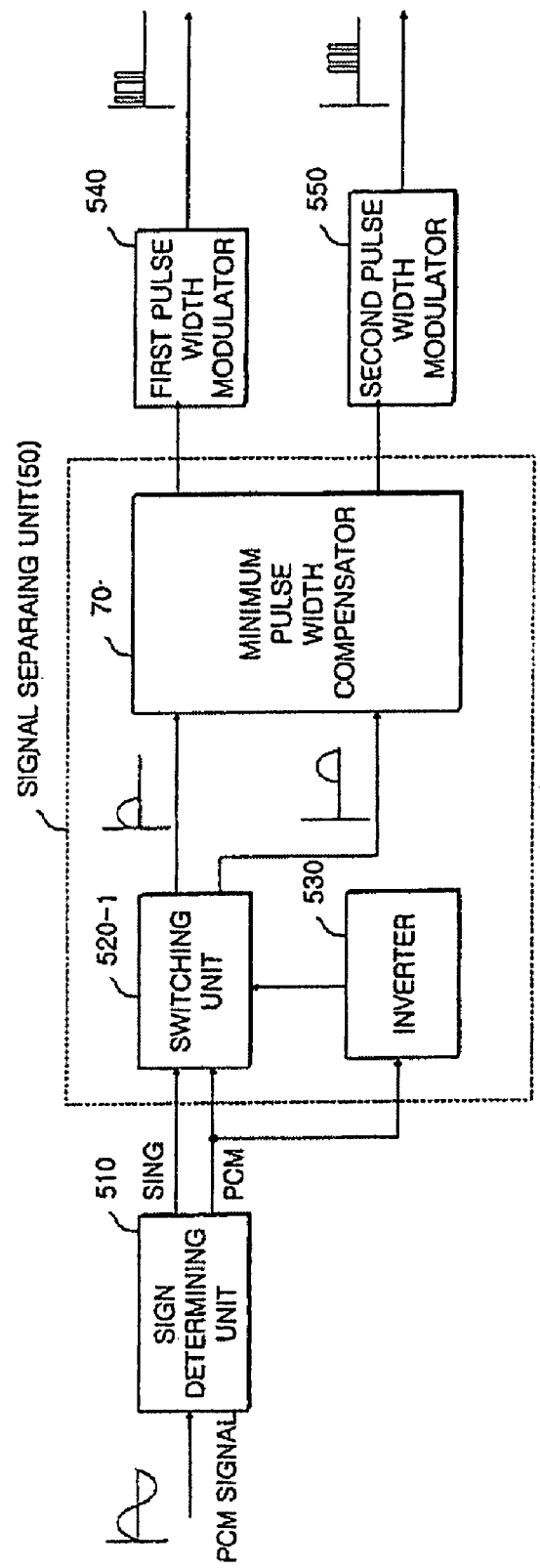
FIG. 9 is a view showing a structure of a digital switching amplifier using a minimum pulse width according to a switching time for a switching unit.

FIG. 9 is a view showing a structure of a digital switching amplifier using a minimum pulse width according to a switching time for a switching unit;

In outputs of the switching unit 520-1, there is a minimum pulse width which can be represented due to a delay of a switching unit itself when ON/OFF are repeated. That is, a pulse having a smaller width than a length of a minimum time required for switching cannot be output correctly by switching. Therefore, in order to prevent signal from being distorted by switching, pulse widths output by switching have to be larger than the minimum pulse width. So, the minimum pulse width compensator 70 adds a value of a PCM for the minimum pulse width to the positive PCM signal and the inverted PCM signal output from the switching unit 520-1, respectively, and transmits them to the first and the second pulse width modulators 540 and 550. When pulse width modulation is performed on the signals compensated for the minimum pulse width, even if a value of an input PCM audio signal is 0, a pulse having pulse width corresponding to the minimum pulse width is output.

Figure 10:
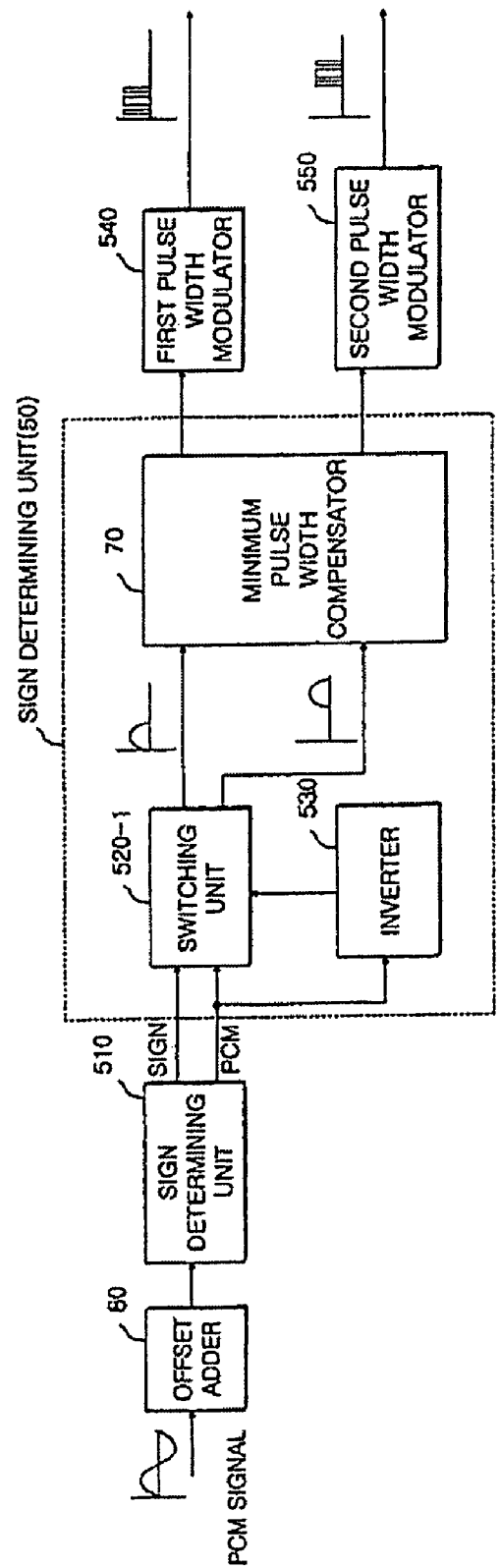
FIG. 10 is a view showing a structure of a digital switching amplifier adding an offset of which signs are alternately changed according to an input period of an input audio signal to the input audio signal.

FIG. 10 is a view showing a structure of a digital switching amplifier adding an offset of which signs are alternately changed according to an input period of the input audio signal to the input audio signal;

When outputs of the positive and negative PCM signals are switched substantially simultaneously by the switching unit 520-1, the switching device in the H-bridge 330 generates interference, so the output signal is distorted. Due to distortion of the output signals, noises occur in an effective bandwidth, so that a signal to noise ratio decreases. Therefore, so as not to simultaneously switch the outputs of the positive and negative PCM signals, offsets with alternating signs are provided to the positive and negative PCM signals, so that the pulse widths of the PCM signals are different from each other. An offset adder 80 adds or subtracts a predetermined value of offset to or from the input PCM audio signals alternately according to an input period of the input PCM audio signal. Pulse width modulation signals, which are a PWM+ and a PWM−, in a case where the aforementioned offset and the minimum pulse width are added, are described in detail with reference to FIG. 11

Figure 11:
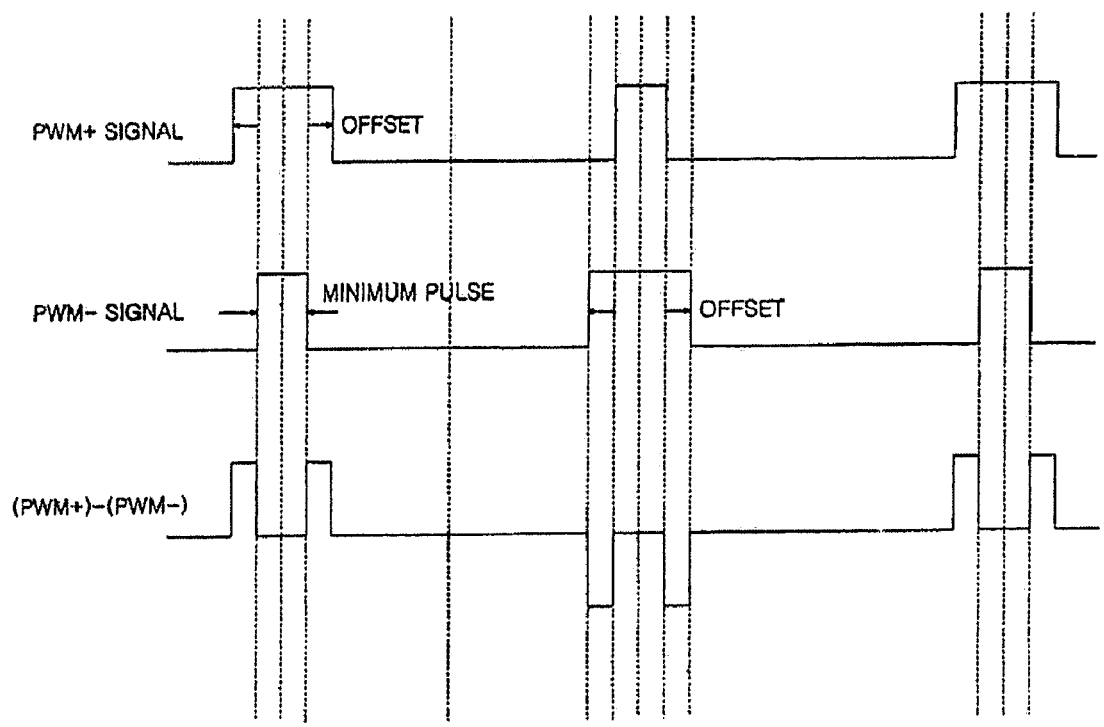
FIG. 11 is a view showing an output signal of the switching amplifier according to the FIG. 10.

FIG. 11 is a view showing an output signal of the switching amplifier according to the FIG. 10;

Referring to FIG. 11, in the case where the aforementioned offset and the minimum pulse width by switching are added, pulse shapes of the PWM+ and the PWM− signals become different from preceding shapes as the positive and negative offsets are added to the input PCM signal alternately. A pulse shape of a differential output resulting of subtracting the PWM− signal from the PWM+ signal become a pulse having a narrow pulse width varying according to a value of the offset.

Figure 12:
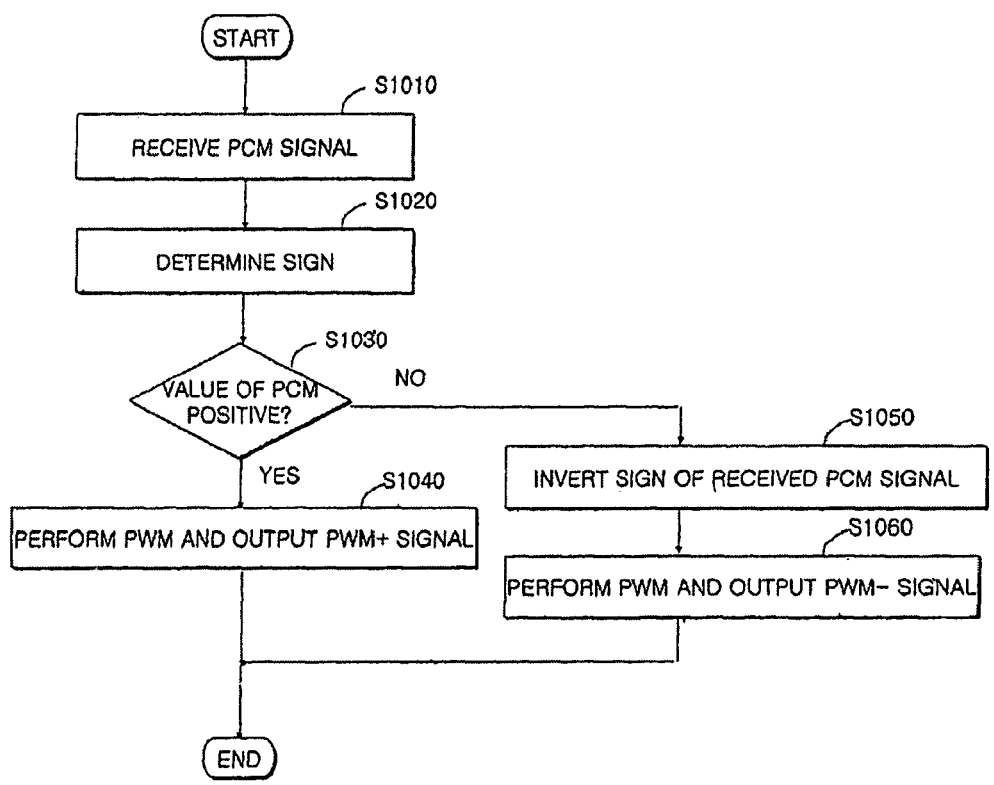
FIG. 12 is a flowchart showing a method of pulse width modulation according to a preferred embodiment of the present invention.

FIG. 12 is a flowchart showing a method of pulse width modulation according to a preferred embodiment of the present invention; and First, a PCM signal is received (S1010), and it is determined whether a sign of the PCM is positive or negative (S1020). The determination is performed by reading a most significant bit of the input PCM signal. In a case where the PCM signal is represented as 2's complement, if the most significant bit is '0', the PCM signal is a positive number. If the most significant bit is '1', the PCM signal is a negative number. When it is determined that the PCM is a positive number (S1030), the input PCM signal is modulated and output as a PWM+ signal. When it is determined that the PCM is not a positive number, the received PCM signal is inverted by multiplying −1 (S1050), and pulse width modulated and output as PWM− signal (S1060).

Figure 13:
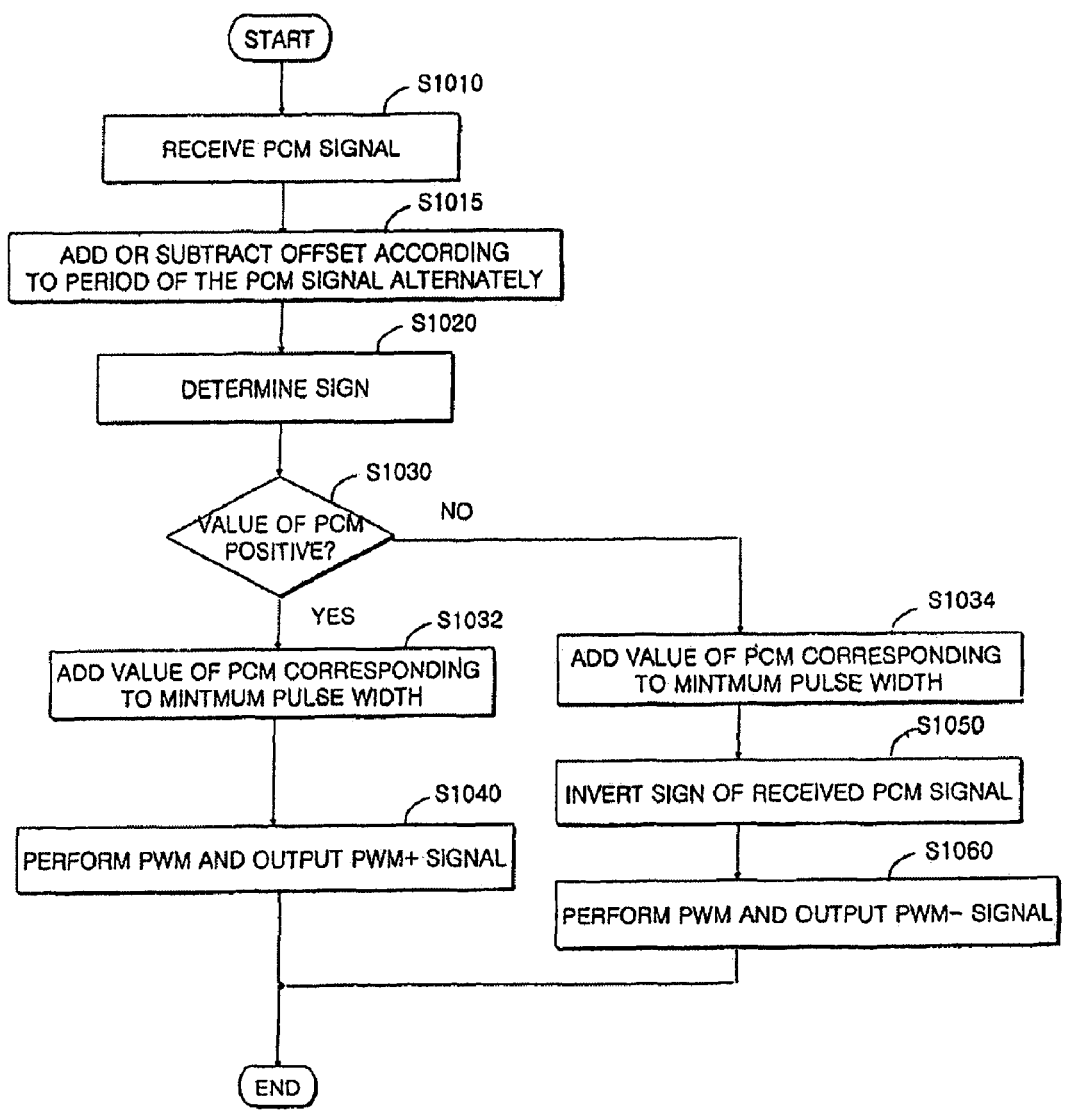
FIG. 13 is a flowchart showing a method of pulse width modulation according to another embodiment of the present invention.

FIG. 13 is a flowchart showing a method of pulse width modulation according to another embodiment of the present invention.

Referring to FIGS. 9 and 10, the method of pulse width modulation, in a case where a pulse width and an offset are added, is described. After a PCM signal is received (S1010), a step of adding and subtracting a predetermined offset to or from the input PCM audio signal alternately according to an input period of the signal is added (S1015). It is determined whether a sign of adding or subtracting the offset is positive or negative (S1020). It is determined whether or not a resulting value of the offset addition or subtraction is positive PCM value (S1030). If the resulting value is positive PCM value, a value of PCM corresponding to a minimum pulse width for switching is added thereto (S1032), and the pulse width modulation is performed thereon, so that a PWM+ signal is output (S1040). If a resulting value of the offset addition or subtraction is not positive PCM value, a value of PCM, corresponding to a minimum pulse width for switching is also added thereto (S1034), and the received PCM signal is inverted so as to be converted into a positive PCM value (S1050), and the pulse width modulation is performed thereon, so that a PWM− signal is output (S1060).

The method of pulse width modulation described above can be written as computer programs. Codes and code segments for accomplishing the present invention can be easily construed by programmers skilled in the art to which the present invention pertains. Also, the programs are stored in computer readable media, and embody the method of pulse width modulation by being read and executed by a computer system. Examples of the computer readable media include magnetic recording media, optical recording media, and carrier wave media.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

INDUSTRIAL APPLICABILITY

As describe above, according to the present invention, residual noises output from a switching amplifier decrease and bias currents applied to load decrease, thereby reducing heat generation and enhancing amplification efficiency. Furthermore, pop noises generated at operation (ON/OFF) of the amplifier decrease.

The invention claimed is:

1. A method of output pulse width modulation in a digital amplifier comprising:
   a determining step of outputting a value by adding or subtracting a value corresponding to a predetermined offset to or from an input audio signal alternately according to a period of the input audio signal, thereby determining a sign of the value output by adding or subtracting based on a most significant bit of the value output by adding or subtracting;
   a switching step of outputting the input audio signal to a first port when the determined sign is positive, and outputting the input audio signal to a second port after inverting the input audio signal into a positive number when the determined sign is negative;
   an adjusting step of adding a predetermined value corresponding to a pulse width for a minimum time required for switching to the audio signals output from the first port and the second port, and outputting a resulting value of adding; and
   a modulating step of performing pulse width modulation on the audio signals output from the adjusting step and outputting a first modulation signal and a second modulation signal.

2. The method of claim 1, wherein the input audio signal is a PCM (pulse code modulation) signal.

3. An apparatus for output pulse width modulation in a digital amplifier comprising:
   an offset adder outputting a value by adding or subtracting a value corresponding to a predetermined offset to or from an input audio signal alternately according to a period of the input audio signal;
   a sign determining unit determining a sign of the value output from the offset adder based on a most significant bit of the value output from the offset adder;
   an inverter and a switching unit outputting the audio signal to a first port when the determined sign is positive, and outputting the input audio signal to a second port after inverting the input audio signal into a positive number when the determined sign is negative;
   a minimum pulse width compensator adding a predetermined value corresponding to a pulse width for a minimum time required for switching to the audio signals output from the first port and the second port, and outputting resulting values of adding; and
   a modulation unit performing pulse width modulation on the audio signals output from the minimum pulse width compensator and outputting a first modulation signal and a second modulation signal.

4. The apparatus of claim 3, wherein the input audio signal is a PCM signal.

* * * * *